US011735465B2

(12) United States Patent
Sugakawa et al.

(10) Patent No.: US 11,735,465 B2
(45) Date of Patent: Aug. 22, 2023

(54) SUBSTRATE PROCESSING APPARATUS AND SUBSTRATE PROCESSING METHOD

(71) Applicant: Tokyo Electron Limited, Tokyo (JP)

(72) Inventors: Kenji Sugakawa, Koshi (JP); Yosuke Omori, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 88 days.

(21) Appl. No.: 16/962,680

(22) PCT Filed: Jan. 9, 2019

(86) PCT No.: PCT/JP2019/000371
§ 371 (c)(1),
(2) Date: Jul. 16, 2020

(87) PCT Pub. No.: WO2019/142708
PCT Pub. Date: Jul. 25, 2019

(65) Prior Publication Data
US 2020/0365442 A1 Nov. 19, 2020

(30) Foreign Application Priority Data
Jan. 17, 2018 (JP) .................................. 2018-005987

(51) Int. Cl.
*H01L 21/68* (2006.01)
*H01L 21/683* (2006.01)
(Continued)

(52) U.S. Cl.
CPC .... *H01L 21/6838* (2013.01); *H01L 21/67092* (2013.01); *H01L 21/68* (2013.01); *H01L 21/6875* (2013.01); *H01L 21/68742* (2013.01)

(58) Field of Classification Search
CPC ..... H01L 21/683; H01L 21/6838; B23Q 3/08; B23Q 3/088; B25B 11/005
(Continued)

(56) References Cited

U.S. PATENT DOCUMENTS

2016/0155721 A1* 6/2016 Sugakawa ............ H01L 21/681
438/5

FOREIGN PATENT DOCUMENTS

JP 2015-038982 A 2/2015
JP 2015038982 A * 2/2015
(Continued)

OTHER PUBLICATIONS

International Search Report issued in Application No. PCT/JP2019/000371, dated Apr. 2, 2019.

*Primary Examiner* — Lee D Wilson
(74) *Attorney, Agent, or Firm* — Pearne & Gordon LLP

(57) ABSTRACT

A substrate processing apparatus includes a holder having thereon an attraction surface configured to attract a substrate and including, as multiple regions in which attracting pressures for attracting the substrate are controlled independently, a first region having a circular shape and a second region having an annular shape and disposed at an outside of the first region in a diametrical direction; multiple attracting pressure generators configured to independently generate the attracting pressures respectively in the multiple regions forming the attraction surface; multiple attracting pressure adjusters configured to independently adjust the attracting pressures respectively generated by the attracting pressure generators; and a controller configured to control the multiple attracting pressure generators and the multiple attracting pressure adjusters. The controller generates different attracting pressures in at least a part of the first region and in at least a part of the second region.

7 Claims, 12 Drawing Sheets

(51) Int. Cl.
*H01L 21/67* (2006.01)
*H01L 21/687* (2006.01)

(58) Field of Classification Search
USPC .......................................................... 269/21
See application file for complete search history.

(56) References Cited

FOREIGN PATENT DOCUMENTS

| | | |
|---|---|---|
| JP | 2015-095579 A | 5/2015 |
| JP | 2016-103536 A | 6/2016 |
| JP | 2018-046244 A | 3/2018 |
| WO | 2017/137129 A1 | 8/2017 |
| WO | 2017/155002 A1 | 9/2017 |
| WO | WO-2017155002 A1 * 9/2017 ............. H01L 21/02 |

\* cited by examiner

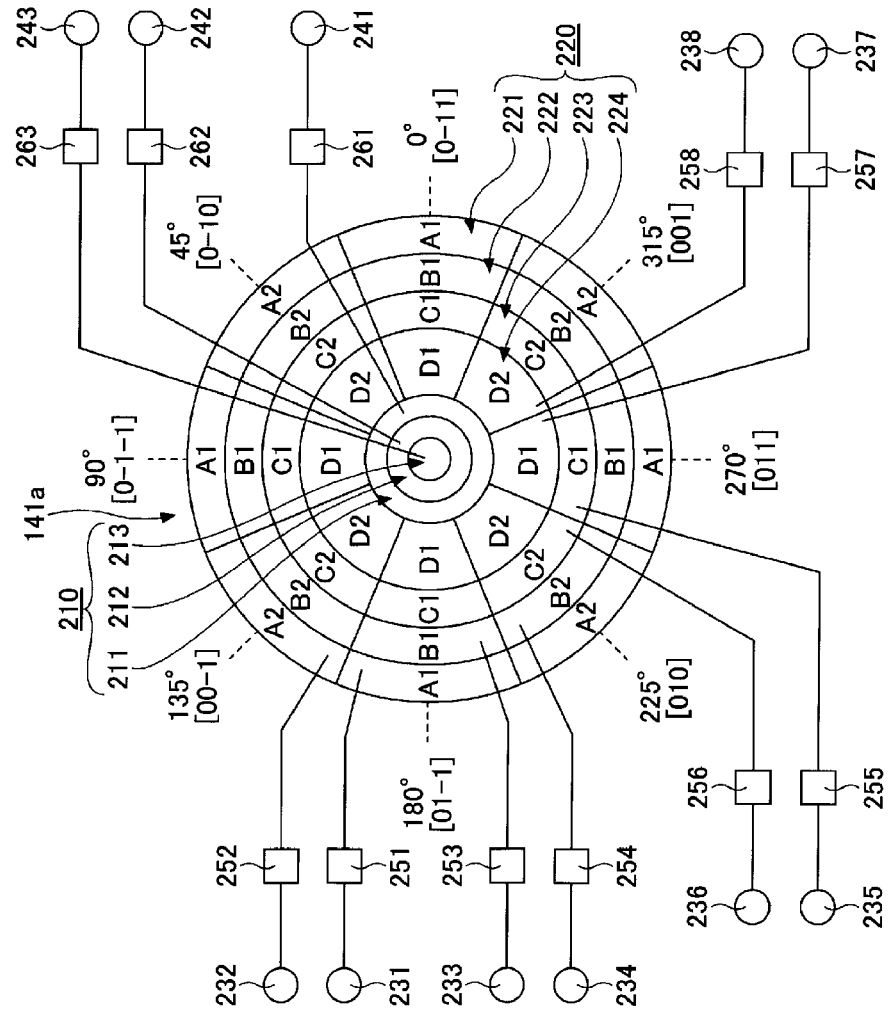

SUBSTRATE PROCESSING APPARATUS AND SUBSTRATE PROCESSING METHOD

TECHNICAL FIELD

The various aspects and embodiments described herein pertain generally to a substrate processing apparatus and a substrate processing method.

BACKGROUND

A bonding apparatus described in Patent Document 1 is equipped with an upper chuck configured to attract a substrate at an upper side from above it and a lower chuck configured to attract a substrate at a lower side from below it. While being held to face each other, the two substrates are bonded. To elaborate, the bonding apparatus brings a central portion of the upper substrate attracted by the upper chuck into contact with a central portion of the lower substrate attracted by the lower chuck by pressing down the central portion of the upper substrate. Accordingly, the central portions of the two substrates are bonded by an intermolecular force or the like. Then, the bonding apparatus expands a bonding region between the two substrates from the central portions of the substrates to peripheral portions thereof.

PRIOR ART DOCUMENT

Patent Document 1: Japanese Patent Laid-open Publication No. 2015-095579

DISCLOSURE OF THE INVENTION

Means for Solving the Problems

In an exemplary embodiment, a substrate processing apparatus includes a holder having thereon an attraction surface configured to attract a substrate and including, as multiple regions in which attracting pressures for attracting the substrate are controlled independently, a first region having a circular shape and a second region having an annular shape and disposed at an outside of the first region in a diametrical direction; multiple attracting pressure generators configured to independently generate the attracting pressures respectively in the multiple regions forming the attraction surface; multiple attracting pressure adjusters configured to independently adjust the attracting pressures respectively generated by the attracting pressure generators; and a controller configured to control the multiple attracting pressure generators and the multiple attracting pressure adjusters. The controller generates different attracting pressures in at least a part of the first region and in at least a part of the second region.

BRIEF DESCRIPTION OF THE DRAWINGS

FIG. 12 is a diagram illustrating a lower chuck, vacuum pumps and vacuum regulators according to a third modification example.

DETAILED DESCRIPTION

Figure 1:
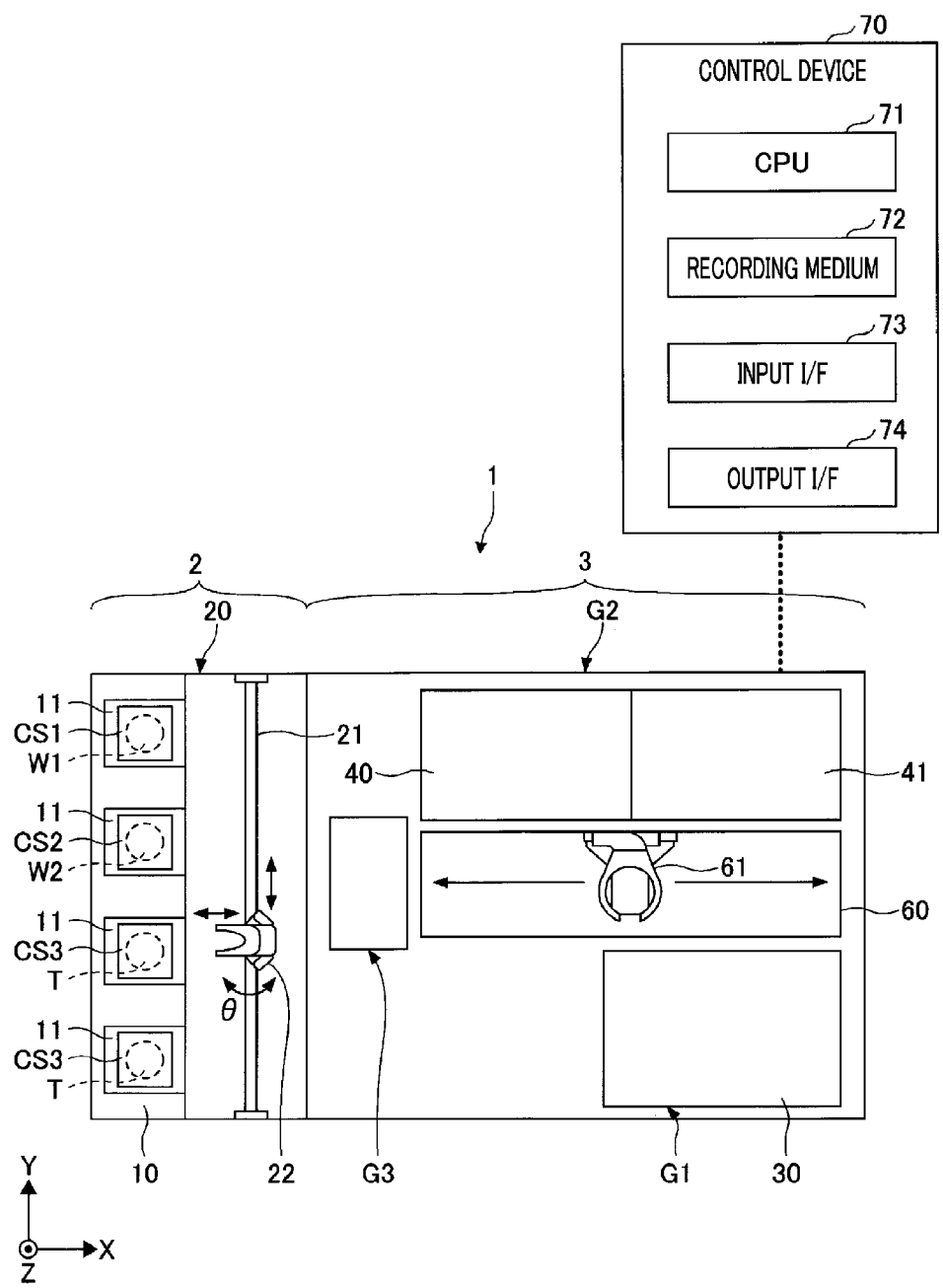
FIG. 1 is a plan view illustrating a bonding system according to an exemplary embodiment.

Hereinafter, exemplary embodiments of the present disclosure will be described in detail with reference to the accompanying drawings. In the various drawings, same or corresponding parts will be assigned same reference numerals, and redundant description may be omitted. In the following description, the X-axis direction, the Y-axis direction and the Z-axis direction are orthogonal to each other, and the X-axis and Y-axis directions are horizontal directions whereas the Z-axis direction is a vertical direction. A rotational direction around a vertical axis is also referred to as "θ direction." In the present specification, below means vertically below, and above means vertically above.

<Bonding System>

Figure 2:
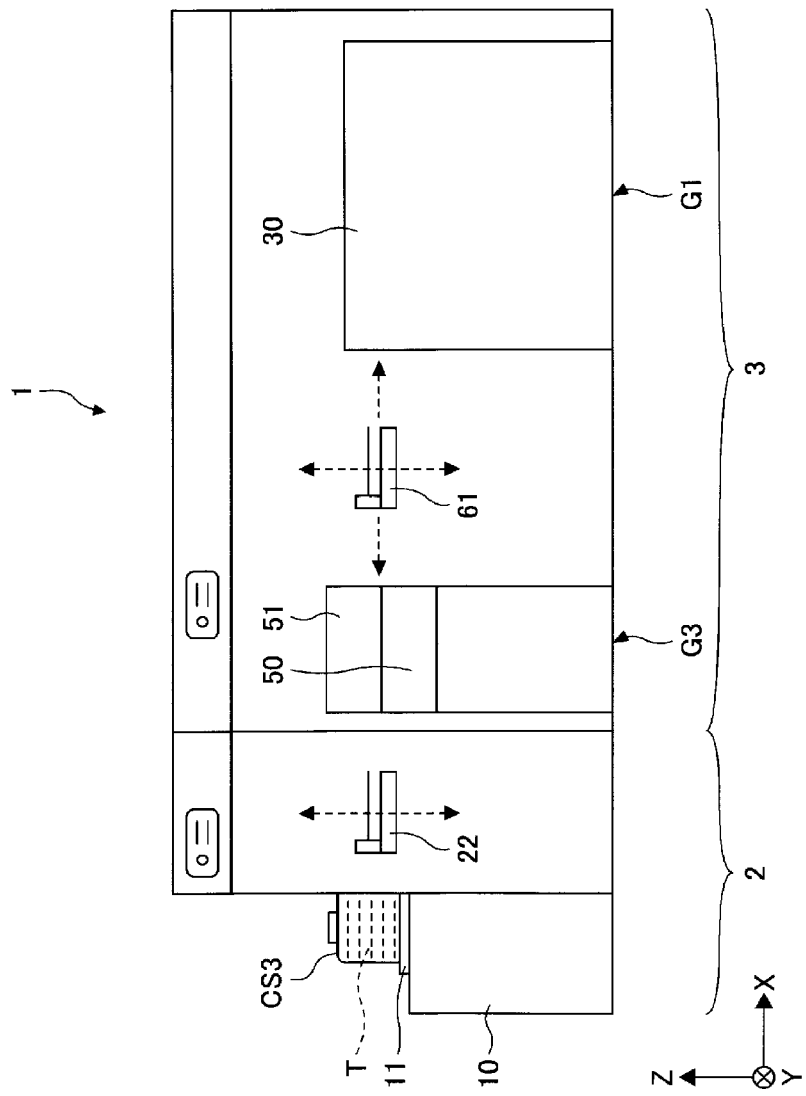
FIG. 2 is a side view illustrating the bonding system according to the exemplary embodiment.
Figure 3:
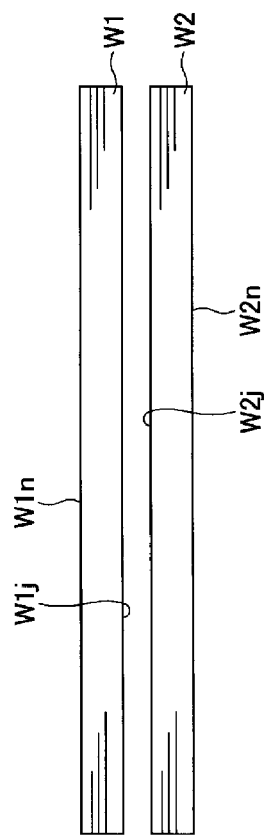
FIG. 3 is a side view illustrating a state before a first substrate and a second substrate are bonded according to the exemplary embodiment.

FIG. 1 is a plan view illustrating a bonding system 1 according to an exemplary embodiment. FIG. 2 is a side view illustrating the bonding system 1 according to the exemplary embodiment. FIG. 3 is a side view illustrating a state before a first substrate and a second substrate are bonded according to the exemplary embodiment. The bonding system 1 shown in FIG. 1 forms a combined substrate T (see FIG. 7B) by bonding a first substrate W1 and a second substrate W2.

The first substrate W1 is, for example, a semiconductor substrate such as a silicon wafer or a compound semiconductor wafer on which multiple electronic circuits are formed. The second substrate W2 is, for example, a bare wafer on which no electronic circuit is formed. The first substrate W1 and the second substrate W2 have the substantially same diameter. Further, the second substrate W2 may have an electronic circuit formed thereon.

In the following description, the first substrate W1 may sometimes be referred to as "upper wafer W1"; the second substrate W2, "lower wafer W2"; and the combined substrate T, "combined wafer T." Further, in the following description, as depicted in FIG. 3, among surfaces of the upper wafer W1, a surface to be bonded to the lower wafer W2 will be referred to as "bonding surface W1j", and a surface opposite to the bonding surface W1j will be referred to as "non-bonding surface W1n". Further, among surfaces of the lower wafer W2, a surface to be bonded to the upper wafer W1 will be referred to as "bonding surface W2j", and a surface opposite to the bonding surface W2j will be referred to as "non-bonding surface W2n."

As depicted in FIG. 1, the bonding system 1 includes a carry-in/out station 2 and a processing station 3. The carry-in/out station 2 and the processing station 3 are arranged in this sequence along the positive X-axis direction. Further, the carry-in/out station 2 and the processing station 3 are connected as a single body.

The carry-in/out station 2 includes a placing table 10 and a transfer section 20. The placing table 10 is equipped with a multiple number of placing plates 11. Provided on the placing plates 11 are cassettes CS1, CS2 and CS3 each of which accommodates therein a plurality of (e.g., 25 sheets of) substrates horizontally. For example, the cassette CS1 accommodates therein upper wafers W1; the cassette CS2, lower wafers W2; and the cassettes CS3, combined wafers T.

The transfer section 20 is provided adjacent to the positive X-axis side of the placing table 10. Provided in the transfer section 20 are a transfer path 21 extending in the Y-axis direction and a transfer device 22 configured to be movable along the transfer path 21. The transfer device 22 is configured to be movable in the X-axis direction as well as in the Y-axis direction and pivotable around the Z-axis. Further, the transfer device 22 is also configured to transfer the upper wafers W1, the lower wafers W2 and the combined wafers T between the cassettes CS1 to CS3 placed on the placing plates 11 and a third processing block G3 of the processing station 3 to be described later.

Further, the number of the cassettes CS1 to CS3 placed on the placing plates 11 is not limited to the shown example. In addition, besides the cassettes CS1 to CS3, a cassette for collecting a problematic substrate or the like may be additionally provided on the placing plates 11.

A multiple number of, for example, three processing blocks G1, G2 and G3 equipped with various kinds of devices are provided in the processing station 3. For example, the first processing block G1 is provided at a front side (negative Y-axis side of FIG. 1) of the processing station 3, and the second processing block G2 is provided at a rear side (positive Y-axis side of FIG. 1) of the processing station 3. Further, the third processing block G3 is provided at a side of the carry-in/out station 2 (negative X-axis side of FIG. 1) of the processing station 3.

Provided in the first processing block G1 is a surface modifying apparatus 30 configured to modify the bonding surface W1j of the upper wafer W1 and the bonding surface W2j of the lower wafer W2. In the surface modifying apparatus 30, a $SiO_2$ bond on the bonding surfaces W1j and W2j of the upper wafer W1 and the lower wafer W2 is cut to be turned into SiO of a single bond, so that the bonding surfaces W1j and W2j are modified such that these surfaces are easily hydrophilized afterwards.

Furthermore, in the surface modifying apparatus 30, for example, an oxygen gas or a nitrogen gas as a processing gas is excited into plasma under a decompressed atmosphere to be ionized. As these oxygen ions or nitrogen ions are irradiated to the bonding surfaces W1j and W2j of the upper wafer W1 and the lower wafer W2, the bonding surfaces W1j and W2j are plasma-processed to be modified.

In the second processing block G2, a surface hydrophilizing apparatus 40 and a bonding apparatus 41 are disposed. The surface hydrophilizing apparatus 40 is configured to hydrophilize and clean the bonding surfaces W1j and W2j of the upper wafer W1 and the lower wafer W2 with, for example, pure water. In this surface hydrophilizing apparatus 40, while rotating the upper wafer W1 or the lower wafer W2 held by, for example, a spin chuck, the pure water is supplied onto the upper wafer W1 or the lower wafer W2. Accordingly, the pure water supplied onto the upper wafer W1 or the lower wafer W2 is diffused onto the bonding surface W1j of the upper wafer W1 or the bonding surface W2j of the lower wafer W2, so that the bonding surfaces W1j and W2j are hydrophilized.

The bonding apparatus 41 is configured to bond the upper wafer W1 and the lower wafer W2, which are hydrophilized, by an intermolecular force. A configuration of the bonding apparatus 41 will be discussed later.

In the third processing block G3, as shown in FIG. 2, transition (TRS) devices 50 and 51 for the upper wafer W1, the lower wafer W2 and the combined wafer T are provided in two levels in this order from below.

Further, as illustrated in FIG. 1, a transfer section 60 is formed in a region surrounded by the first processing block G1, the second processing block G2 and the third processing block G3. A transfer device 61 is provided in the transfer section 60. The transfer device 61 is equipped with, for example, a transfer arm which is configured to be movable in a vertical direction and a horizontal direction and pivotable around a vertical axis. The transfer device 61 is moved within the transfer section 60 and transfers the upper wafers W1, the lower wafers W2 and the combined wafers T with respect to preset devices within the first processing block G1, the second processing block G2 and the third processing block G3 which are adjacent to the transfer section 60.

Furthermore, as depicted in FIG. 1, the bonding system 1 includes a control device 70. The control device 70 controls an operation of the bonding system 1. The control device 70 may be implemented by, for example, a computer and includes, as illustrated in FIG. 1, a CPU (Central Processing Unit) 71, a recording medium 72 such as a memory, an input interface 73 and an output interface 74. The control device 70 carries out various kinds of controls by allowing the CPU 71 to execute a program stored in the recording medium 72. Further, the control device 70 receives a signal from an outside through the input interface 73 and transmits a signal to the outside through the output interface 74.

The program of the control device 70 is recorded in an information recording medium and installed from the information recording medium. The information recording medium may be, by way of non-limiting example, a hard disc (HD), a flexible disc (FD), a compact disc (CD), a magnet optical disc (MO), or a memory card. Further, the program may be installed by being downloaded from a server through Internet.

<Bonding Apparatus>

Figure 4:
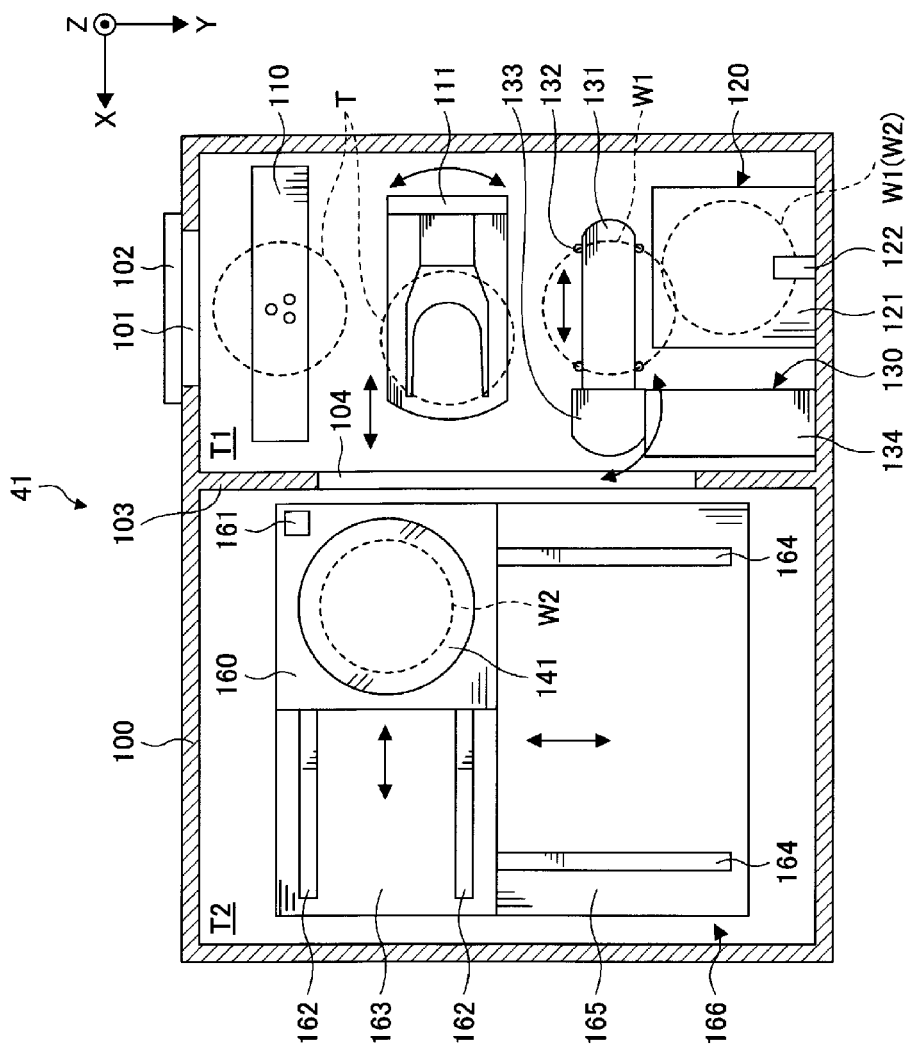
FIG. 4 is a plan view illustrating a bonding apparatus according to the exemplary embodiment.
Figure 5:
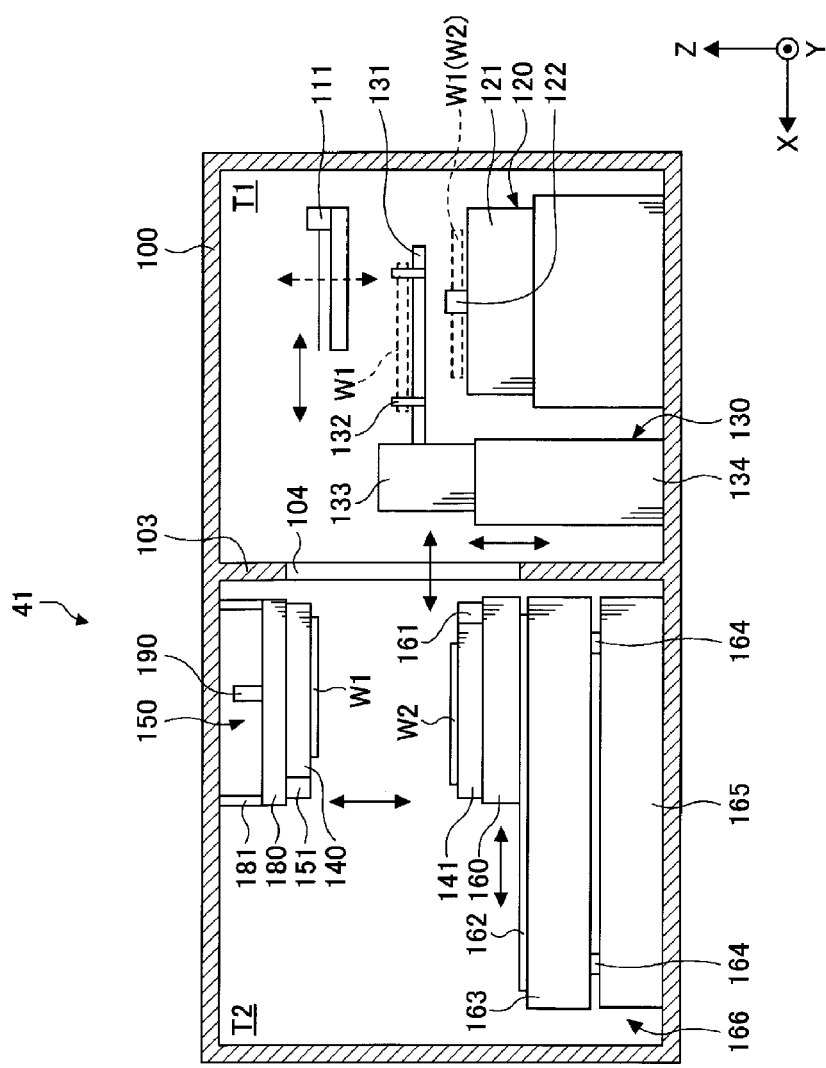
FIG. 5 is a side view illustrating the bonding apparatus according to the exemplary embodiment.

FIG. 4 is a plan view illustrating the bonding apparatus 41 according to the exemplary embodiment. FIG. 5 is a side view illustrating the bonding apparatus 41 according to the exemplary embodiment.

As depicted in FIG. 4, the bonding apparatus 41 includes a processing vessel 100 having a hermetically sealable inside. A carry-in/out opening 101 for the upper wafer W1, the lower wafer W2 and the combined wafer T is formed on a lateral side of the processing vessel 100 at a side of the transfer section 60. A shutter 102 for opening/closing the carry-in/out opening 101 is provided at the carry-in/out opening 101.

The inside of the processing vessel 100 is partitioned into a transfer region T1 and a processing region T2 by an inner wall 103. The aforementioned carry-in/out opening 101 is formed at a side surface of the processing vessel 100 in the transfer region T1. Further, a carry-in/out opening 104 for the upper wafer W1, the lower wafer W2 and the combined wafer T is formed at the inner wall 103.

In the transfer region T1, a transition 110, a wafer transfer device 111, an inverting device 130 and a position adjusting device 120 are arranged side by side in this sequence from, for example, a carry-in/out opening 101 side.

The transition 110 is configured to temporarily place thereon the upper wafer W1, the lower wafer W2 and the combined wafer T. The transition 110 has, for example, two levels, and is capable of holding any two of the upper wafer W1, the lower wafer W2 and the combined wafer T.

The wafer transfer device 111 is equipped with a transfer arm configured to be movable in the vertical direction (Z-axis direction) and the horizontal directions (Y-axis direction and X-axis direction) and also pivotable around a vertical axis, as shown in FIG. 4 and FIG. 5. The wafer transfer device 111 is capable of transferring the upper wafer W1, the lower wafer W2 and the combined wafer T within the transfer region T1 or between the transfer region T1 and the processing region T2.

The position adjusting device 120 is configured to adjust a direction of the upper wafer W1 (lower wafer W2) in the horizontal direction. To elaborate, the position adjusting device 120 includes a base 121 equipped with a non-illustrated holder configured to hold and rotate the upper wafer W1 (lower wafer W2); and a detector 122 configured to detect a position of a notch of the upper wafer W1 (lower wafer W2). The position adjusting device 120 adjusts the position of the notch of the upper wafer W1 (lower wafer W2) by detecting the position of the notch with the detector 122 while rotating the upper wafer W1 (lower wafer W2) held by the base 121. Accordingly, the position of the upper wafer W1 (lower wafer W2) in the horizontal direction is adjusted.

The inverting device 130 is configured to invert a front surface and a rear surface of the upper wafer W1. To elaborate, the inverting device 130 is equipped with a holding arm 131 configured to hold the upper wafer W1. The holding arm 131 extends in the horizontal direction (X-axis direction). Further, the holding arm 131 is provided with, at four positions, for example, holding members 132 configured to hold the upper wafer W1.

The holding arm 131 is supported by a driving unit 133 having, for example, a motor or the like. The holding arm 131 is configured to be rotatable around a horizontal axis by the driving unit 133. Further, the holding arm 131 is rotatable around the driving unit 133 and movable in the horizontal direction (X-axis direction). Another driving unit (not shown) including, for example, a motor or the like is provided under the driving unit 133. The driving unit 133 can be moved in the vertical direction along a vertically extending supporting column 134 by this another driving unit.

Further, the upper wafer W1 held by the holding members 132 can be rotated around the horizontal axis by the driving unit 133 and can also be moved in the vertical direction and the horizontal direction. Further, the upper wafer W1 held by the holding members 132 can be moved between the position adjusting device 120 and an upper chuck 140 to be described later by being rotated around the driving unit 133.

Provided within the processing region T2 are the upper chuck 140 configured to attract and hold a top surface (non-bonding surface W1n) of the upper wafer W1 from above and a lower chuck 141 configured to place thereon the lower wafer W and attract and hold a bottom surface (non-bonding surface W2n) of the lower wafer W2 from below. The lower chuck 141 is provided under the upper chuck 140 and configured to be arranged to face the upper chuck 140 in parallel.

As depicted in FIG. 5, the upper chuck 140 is held by an upper chuck holder 150 which is provided above the upper chuck 140. The upper chuck holder 150 is provided at a ceiling surface of the processing vessel 100. The upper chuck 140 is fixed to the processing vessel 100 with the upper chuck holder 150 therebetween.

The upper chuck holder 150 is equipped with an upper imaging device 151 configured to image a top surface (bonding surface W2j) of the lower wafer W2 held by the lower chuck 141. By way of example, a CCD camera is used as the upper imaging device 151.

The lower chuck 141 is supported by a first lower chuck mover 160 provided below the lower chuck 141. The first lower chuck mover 160 moves the lower chuck 141 in the horizontal direction (X-axis direction) as will be described later. Further, the first lower chuck mover 160 is also configured to be capable of moving the lower chuck 141 in the vertical direction and rotate the lower chuck 141 around a vertical axis.

The first lower chuck mover 160 is equipped with a lower imaging device 161 configured to image a bottom surface (bonding surface W1j) of the upper wafer W1 held by the upper chuck 140 (see FIG. 5). The lower imaging device 161 may be, by way of example, a CCD camera.

The first lower chuck mover 160 is fastened to a pair of rails 162 which is provided at a bottom side of the first lower chuck mover 160 and extends in the horizontal direction (X-axis direction). The first lower chuck mover 160 is configured to be movable along the rails 162.

The rails 162 are disposed on a second lower chuck mover 163. The second lower chuck mover 163 is fastened to a pair of rails 164 which is disposed at a bottom side of the second lower chuck mover 163 and extends in the horizontal direction (Y-axis direction). The second lower chuck mover 163 is configured to be movable in the horizontal direction (Y-axis direction) along the rails 164. Further, the rails 164 is disposed on the placing table 165 which is disposed at a bottom of the processing vessel 100.

The first lower chuck mover 160, the second lower chuck mover 163, and so forth constitute a position adjuster 166. The position adjuster 166 is configured to perform position adjustment in the horizontal direction between the upper wafer W1 held by the upper chuck 140 and the lower wafer W2 held by the lower chuck 141 by moving the lower chuck 141 in the X-axis direction, the Y-axis direction and the θ direction. Further, the position adjuster 166 is also configured to perform position adjustment in the vertical direction between the upper wafer W1 held by the upper chuck 140 and the lower wafer W2 held by the lower chuck 141 by moving the lower chuck 141 in the Z-axis direction.

Further, although the position adjuster 166 of the present exemplary embodiment carries out the position adjustment between the upper wafer W1 and the lower wafer W2 in the horizontal direction by moving the lower chuck 141 in the X-axis direction, the Y-axis direction and the θ direction, the present disclosure is not limited thereto. The way how the position adjuster 166 performs this position adjustment in the horizontal direction is not particularly limited as long as the upper chuck 140 and the lower chuck 141 are moved relatively to each other in the X-axis direction, the Y-axis direction and the θ direction. By way of example, the position adjuster 166 may perform the position adjustment in the horizontal direction between the upper wafer W1 and the lower wafer W2 by moving the lower chuck 141 in the X-axis direction and the Y-axis direction and by moving the upper chuck 140 in the θ direction.

Furthermore, although the position adjuster 166 of the present disclosure carries out the position adjustment between the upper wafer W1 and the lower wafer W2 in the vertical direction by moving the lower chuck 141 in the Z-axis direction, the present disclosure is not limited thereto. The way how the position adjuster 166 performs this position adjustment in the vertical direction is not particularly limited as long as the upper chuck 140 and the lower chuck 141 can be moved relatively to each other in the Z-axis direction. By way of example, the position adjuster 166 may perform the position adjustment between the upper wafer W1 and the lower wafer W2 in the vertical direction by moving the upper chuck 140 in the Z-axis direction.

Figure 6:
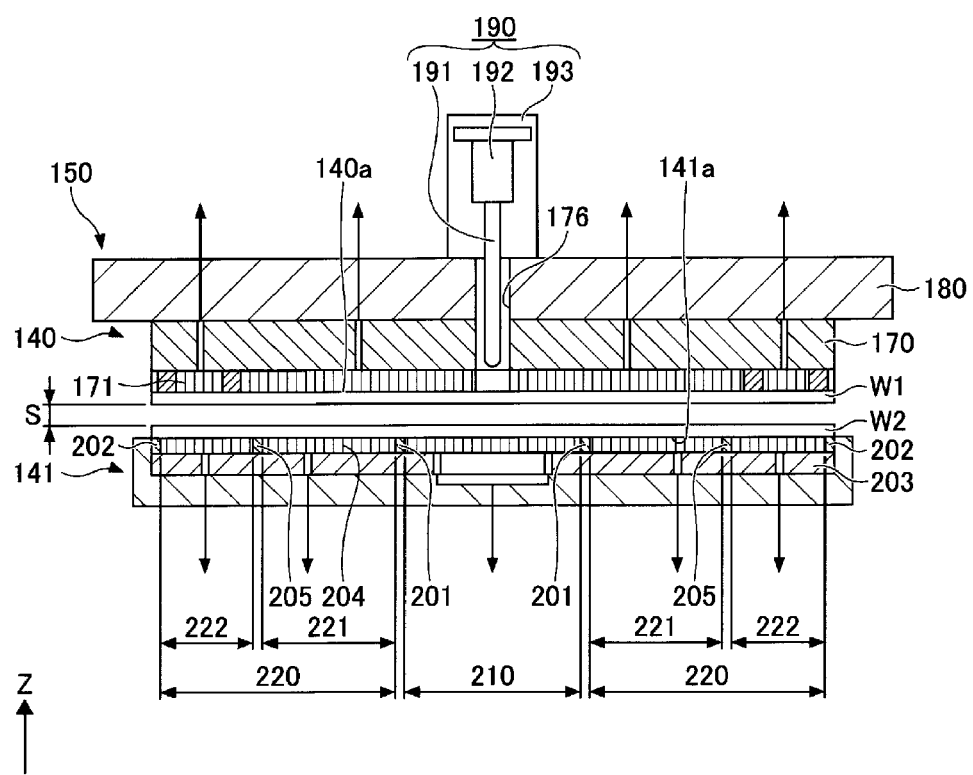
FIG. 6 is a cross sectional view illustrating an upper chuck and a lower chuck according to the exemplary embodiment, showing a state before an upper wafer and a lower wafer are bonded after their positions are adjusted.
Figure 7A:
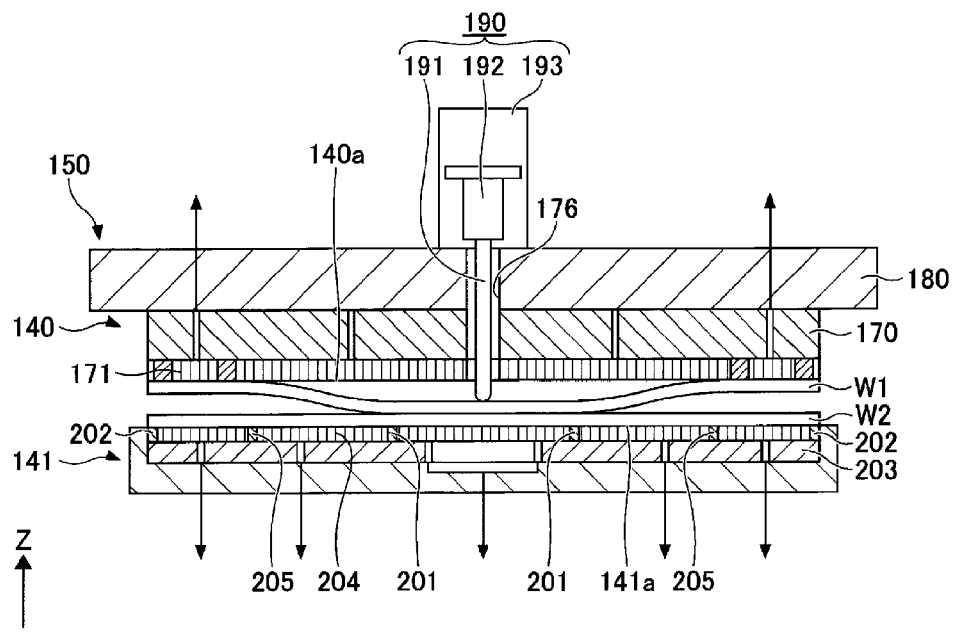
FIG. 7A and FIG. 7B are cross sectional views illustrating an operation through which the upper wafer and the lower wafer are gradually bonded from central portions toward peripheral portions thereof according to the exemplary embodiment.
Figure 7B:
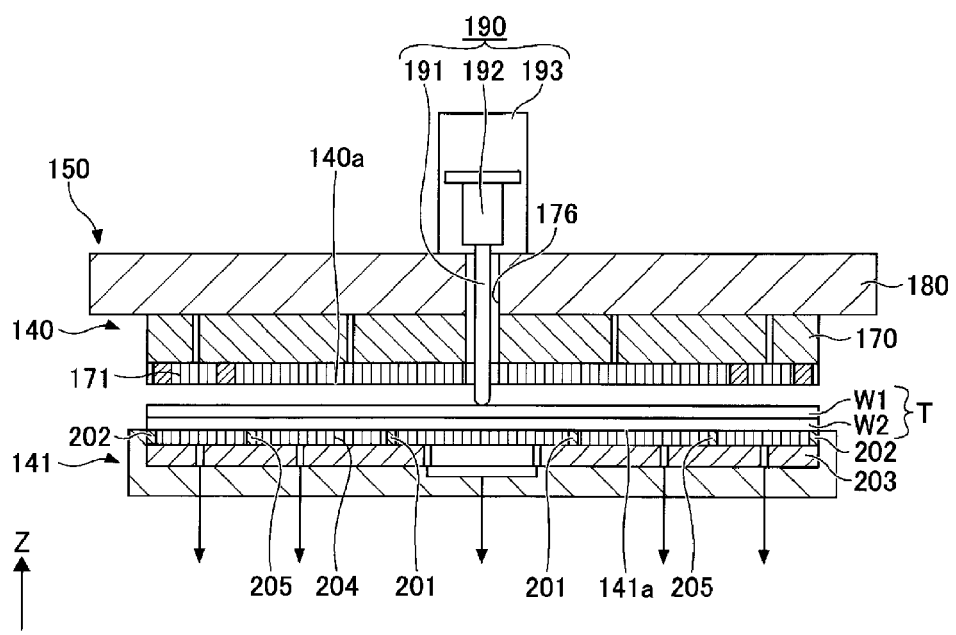

FIG. 6 is a cross sectional view illustrating the upper chuck and the lower chuck according to the exemplary embodiment, showing a state immediately before the upper wafer and the lower wafer are bonded. FIG. 7A is a cross sectional view illustrating a state in the middle of bonding between the upper wafer and the lower wafer according to the present exemplary embodiment. FIG. 7B is a cross sectional view illustrating a state upon the completion of the bonding between the upper wafer and the lower wafer according to the present exemplary embodiment. Solid-lined arrows in FIG. 6, FIG. 7A and FIG. 7B indicate a direction in which air is suctioned by a vacuum pump.

The upper chuck 140 and the lower chuck 141 are, for example, vacuum chucks. The lower chuck 141 corresponds to a holder described in claims, and the upper chuck 140 corresponds to a facing holder described in the claims. Alternatively, as will be described later, the upper chuck 140 may correspond to the holder described in the claims, and the lower chuck 141 may correspond to the facing holder described in the claims. The upper chuck 140 has, at the surface (bottom surface) thereof facing the lower chuck 141, an attraction surface 140a to which the upper wafer W1 is attracted. Meanwhile, the lower chuck 141 has, at the surface (top surface) facing the upper chuck 140, an attraction surface 141a to which the lower wafer W2 is attracted.

The upper chuck 140 has a chuck base 170. The chuck base 170 has a diameter equal to or larger than a diameter of the upper wafer W1. The chuck base 170 is supported by a supporting member 180. The supporting member 180 is disposed to cover at least the chuck base 170 when viewed from the top, and is fixed to the chuck base 170 by, for example, screws. The supporting member 180 is supported by a plurality of supporting columns 181 (see FIG. 5) provided at the ceiling surface of the processing vessel 100. The supporting member 180 and the plurality of supporting columns 181 constitute the upper chuck holder 150.

A through hole 176 is formed through the supporting member 180 and the chuck base 170 in the vertical direction. A position of the through hole 176 corresponds to a central portion of the upper wafer W1 attracted to and held by the upper chuck 140. A push pin 191 of a striker 190 is inserted into this through hole 176.

The striker 190 is provided on a top surface of the supporting member 180 and is equipped with the push pin 191, an actuator unit 192 and a linearly moving mechanism 193. The push pin 191 is a columnar member extending along the vertical direction and is supported by an actuator unit 192.

The actuator unit 192 is configured to generate a constant pressure in a certain direction (here, a vertically downward direction) by air supplied from, for example, an electro-pneumatic regulator (not shown). By the air supplied from the electro-pneumatic regulator, the actuator unit 192 is capable of controlling a press load applied to the central portion of the upper wafer W1 as it is brought into contact with the central portion of the upper wafer W1. Further, a leading end of the push pin 191 is movable up and down in the vertical direction through the through hole 176 by the air from the electro-pneumatic regulator.

The actuator unit 192 is supported at the linearly moving mechanism 193. The linearly moving mechanism 193 moves the actuator unit 192 in the vertical direction by a driving unit including a motor, for example.

The striker 190 is configured as described above, and controls a movement of the actuator unit 192 by the linearly moving mechanism 193 and controls the press load upon the upper wafer W1 from the push pin 191 by the actuator unit 192.

The striker 190 presses the upper wafer W1 attracted to and held by the upper chuck 140 and the lower wafer W2 attracted to and held by the lower chuck 141 to allow the upper wafer W1 and the lower wafer W2 to come into contact with each other. To elaborate, the striker 190 transforms the upper wafer W1 attracted to and held by the upper chuck 140, thus allowing the upper wafer W1 to be pressed in contact with the lower wafer W2.

A plurality of pins 171 is provided on a bottom surface of the chuck base 170, and these pins 171 are in contact with the non-bonding surface W1n of the upper wafer W1. The upper chuck 140 is composed of the chuck base 170, the plurality of pins 171, and so forth. The attraction surface 140a of the upper chuck 140 which attracts and holds the upper wafer W1 is divided into multiple regions in a diametrical direction, and generation of an attracting pressure and release of the attracting pressure are performed for divided regions individually.

Further, the lower chuck 141 may be configured the same as the upper chuck 140. The lower chuck 141 has a plurality of pins 204 in contact with the non-bonding surface W2n of the lower wafer W2. The attraction surface 141a of the lower chuck 141 which attracts and holds the lower wafer W2 is divided into multiple regions in the diametrical direction, and generation of an attracting pressure and release of the attracting pressure are performed for divided regions individually.

<Bonding Method>

Figure 8:
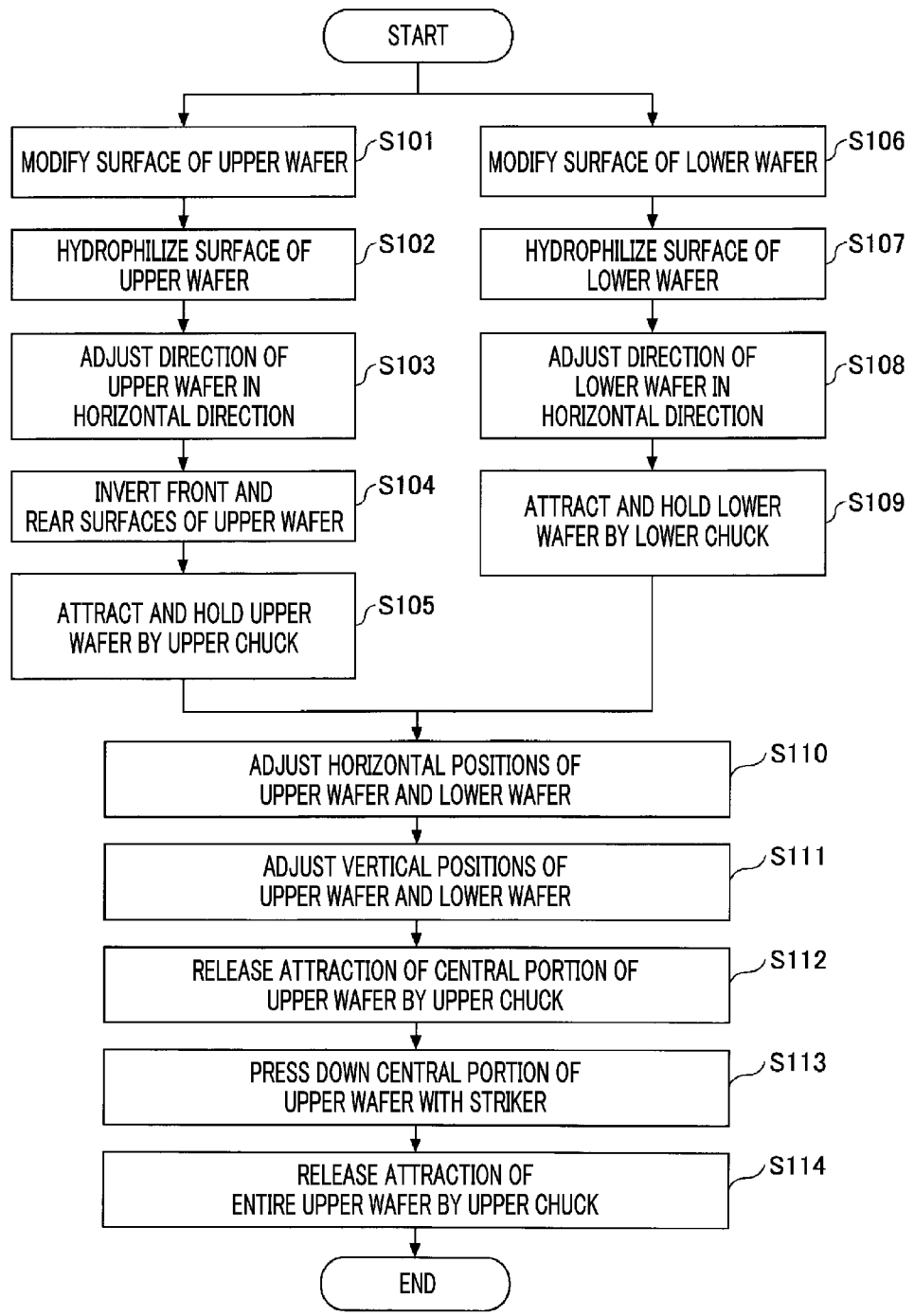
FIG. 8 is a flowchart illustrating a part of a processing performed by the bonding system according to the exemplary embodiment.

FIG. 8 is a flowchart illustrating a part of a processing performed by the bonding system according to the exemplary embodiment. Further, the various processes shown in FIG. 8 are performed under the control of the control device 70.

First, a cassette CS1 accommodating a plurality of upper wafers W1, a cassette CS2 accommodating a plurality of lower wafers W2 and an empty cassette CS3 are placed on the preset placing plates 11 of the carry-in/out station 2. Then, an upper wafer W1 is taken out of the cassette CS1 by the transfer device 22 and is transferred to the transition device 50 of the third processing block G3 of the processing station 3.

Subsequently, the upper wafer W1 is transferred into the surface modifying apparatus 30 of the first processing block G1 by the transfer device 61. In the surface modifying apparatus 30, an oxygen gas as the processing gas is formed into plasma to be ionized under the preset decompressed atmosphere. The oxygen ions are irradiated to the bonding surface W1j of the upper wafer W1, and the bonding surface W1j is plasma-processed. As a result, the bonding surface W1j of the upper wafer W1 is modified (process S101).

Then, the upper wafer W1 is transferred into the surface hydrophilizing apparatus 40 of the second processing block G2 by the transfer device 61. In the surface hydrophilizing apparatus 40, the pure water is supplied onto the upper wafer W1 while rotating the upper wafer W1 held by the spin chuck. The supplied pure water is diffused on the bonding surface W1j of the upper wafer W1, and hydroxyl groups (silanol groups) adhere to the bonding surface W1j of the upper wafer W1 modified in the surface modifying apparatus 30, so that the bonding surface W1j is hydrophilized (process S102). Further, the bonding surface W1j of the upper wafer W1 is cleaned by this pure water used to hydrophilize the bonding surface W1j.

Thereafter, the upper wafer W1 is transferred into the bonding apparatus 41 of the second processing block G2 by the transfer device 61. The upper wafer W1 transferred into the bonding apparatus 41 is then delivered into the position adjusting mechanism 120 via the transition 110 by the wafer transfer mechanism 111. Then, the direction of the upper wafer W1 in the horizontal direction is adjusted by the position adjusting mechanism 120 (process S103).

Subsequently, the upper wafer W1 is delivered from the position adjusting mechanism 120 onto the holding arm 131 of the inverting mechanism 130. Then, in the transfer region T1, by inverting the holding arm 131, the front surface and the rear surface of the upper wafer W1 are inverted (process S104). That is, the bonding surface W1j of the upper wafer W1 is turned to face down.

Afterwards, the holding arm 131 of the inverting mechanism 130 is rotated to be located under the upper chuck 140. Then, the upper wafer W1 is delivered to the upper chuck 140 from the inverting mechanism 130. The non-bonding surface W1n of the upper wafer W1 is attracted to and held by the upper chuck 140 in the state that the notch of the upper wafer W1 is oriented to a predetermined direction (process S105).

While the above-described processes S101 to S105 are being performed on the upper wafer W1, a processing of the lower wafer W2 is performed. First, the lower wafer W2 is taken out of the cassette CS2 by the transfer device 22 and transferred into the transition device 50 of the processing station 3 by the transfer device 22.

Thereafter, the lower wafer W2 is transferred into the surface modifying apparatus 30 by the transfer device 61, and the bonding surface W2j of the lower wafer W2 is modified (process S106). Further, the modification of the bonding surface W2j of the lower wafer W2 in the process S106 is the same as the above-stated process S101.

Then, the lower wafer W2 is transferred into the surface hydrophilizing apparatus 40 by the transfer device 61, and the bonding surface W2j of the lower wafer W2 is hydrophilized (process S107). Further, the bonding surface W2j is cleaned by the pure water used to hydrophilize the bonding surface W2j. The hydrophilizing of the bonding surface W2j of the lower wafer W2 in the process S107 is the same as the hydrophilizing of the bonding surface W1j of the upper wafer W1 in the above-described process S102.

Thereafter, the lower wafer W2 is transferred into the bonding apparatus 41 by the transfer device 61. The lower wafer W2 transferred into the bonding apparatus 41 is then sent into the position adjusting mechanism 120 via the transition 110 by the wafer transfer mechanism 111. Then, the direction of the lower wafer W2 in the horizontal direction is adjusted by the position adjusting mechanism 120 (process S108).

Afterwards, the lower wafer W2 is transferred onto the lower chuck 141 by the wafer transfer mechanism 111 and attracted to and held by the lower chuck 141 (process S109). At this time, the non-bonding surface W2n of the lower wafer W2 is attracted to and held by the lower chuck 141 in the state that the notch of the lower wafer W2 is oriented to the same direction as the notch of the upper wafer W1.

Thereafter, the position adjustment in the horizontal direction between the upper wafer W1 held by the upper chuck 140 and the lower wafer W2 held by the lower chuck 141 is performed (process S110). To elaborate, the horizontal positions (for example, including positions in the X-axis direction, the Y-axis direction and the θ direction) of the upper wafer W1 and the lower wafer W2 are adjusted such that a plurality of alignment marks formed at the bonding surface W1j of the upper wafer W1 and a plurality of alignment marks formed at the bonding surface W2j of the lower wafer W2 are respectively overlapped, when viewed in the vertical direction.

Thereafter, the position adjustment in the vertical direction between the upper wafer W1 held by the upper chuck 140 and the lower wafer W2 held by the lower chuck 141 is performed (process S111). To elaborate, the first lower chuck mover 160 moves the lower chuck 141 in the vertically upward direction, thus allowing the lower wafer W2 to approach the upper wafer W1. Accordingly, as shown in FIG. 6, a distance S between the bonding surface W2j of the lower wafer W2 and the bonding surface W1j of the upper wafer W1 is adjusted to, e.g., 50 µm to 200 µm.

Subsequently, after releasing the attracting and holding of the central portion of the upper wafer W1 by the upper chuck 140 (process S112), the push pin 191 of the striker 190 is lowered, so that the central portion of the upper wafer W1 is pressed down (process S113), as shown in FIG. 7A. If the central portion of the upper wafer W1 comes into contact with the central portion of the lower wafer W2 and the central portion of the upper wafer W1 and the central portion of the lower wafer W2 are pressed against each other with a preset force, the central portion of the upper wafer W1 and the central portion of the lower wafer W2 which are pressed against each other are begun to be bonded. Then, a bonding wave whereby the upper wafer W1 and the lower wafer W2 are gradually bonded from the central portions toward the peripheral portions thereof is generated.

Here, since the bonding surface W1j of the upper wafer W1 and the bonding surface W2j of the lower wafer W2 are modified in the processes S101 and S106, respectively, a Van der Waals force (intermolecular force) is generated between the bonding surfaces W1j and W2j, so that the bonding surfaces W1j and W2j are bonded. Further, since the bonding surface W1j of the upper wafer W1 and the bonding surface W2j of the lower wafer W2 are hydrophilized in the processes S102 and S107, respectively, hydrophilic groups between the bonding surfaces W1j and W2j are hydrogen-bonded, so that the bonding surfaces W1j and W2j are firmly bonded.

Thereafter, while pressing the central portion of the upper wafer W1 and the central portion of the lower wafer W2 with the push pin 191, the attracting and holding of the entire upper wafer W1 by the upper chuck 140 is released (process S114). Accordingly, as depicted in FIG. 7B, the entire bonding surface W1j of the upper wafer W1 and the entire bonding surface W2j of the lower wafer W2 come into contact with each other, and the upper wafer W1 and the lower wafer W2 are bonded. Thereafter, the push pin 191 is raised up to the upper chuck 140, and the attracting and holding of the lower wafer W2 by the lower chuck 141 is released.

Thereafter, the combined wafer T is transferred to the transition device 51 of the third processing block G3 by the transfer device 61, and then is transferred into the cassette CS3 by the transfer device 22 of the carry-in/out station 2. Through these processes, the series of operations of the bonding processing are completed.

<Control Over Distortion of Lower Wafer by Lower Chuck>

Figure 9:
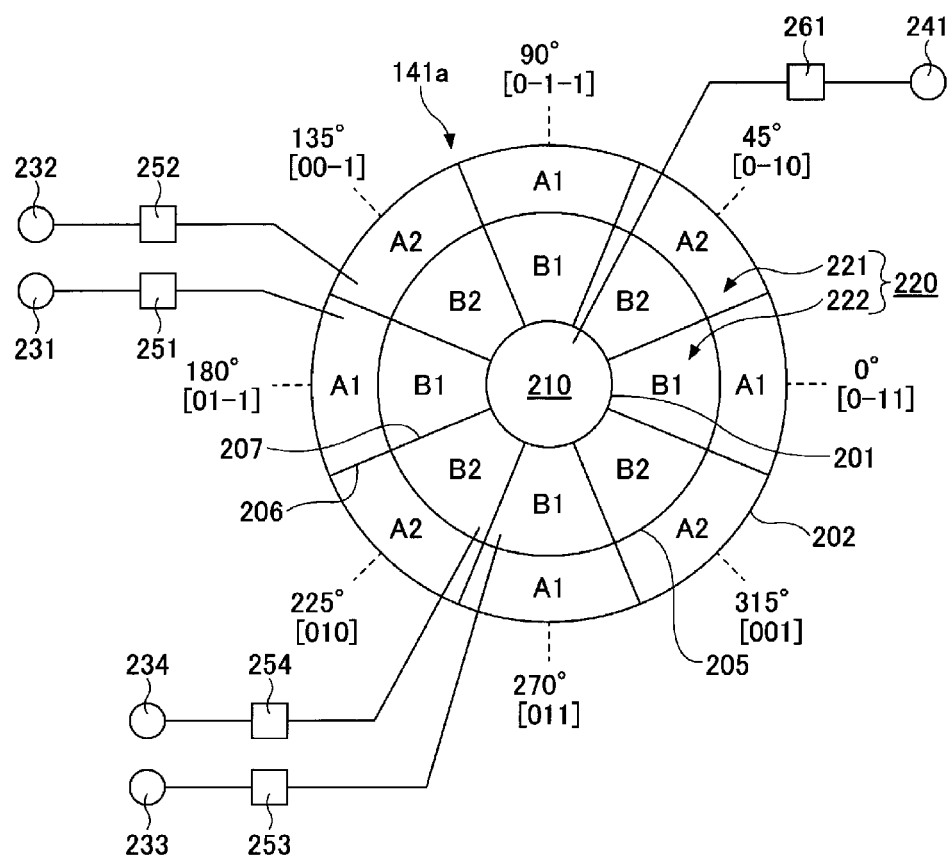
FIG. 9 is a diagram illustrating the lower chuck, vacuum pumps and vacuum regulators according to the exemplary embodiment.

FIG. 9 is a diagram illustrating the lower chuck, vacuum pumps and vacuum regulators according to the exemplary embodiment. FIG. 9 shows angles in the horizontal direction on the attraction surface 141a of the lower chuck 141 and directional indexes of the lower wafer W2 (see FIG. 6 or the like) when it is attracted to the attraction surface 141a. Further, a plane index of the bonding surface W2j of the lower wafer W2 is (100). If a Miller index used as the directional index or the plane index is of a negative value, a sign "-" (bar) is typically put above the number. In the present exemplary embodiment, however, a minus is put before the number. Further, in FIG. 9, the pins 204 are not illustrated for the simplicity of illustration.

The attraction surface 141a of the lower chuck 141 has, as multiple regions in which attracting pressures (for example, vacuum pressures) for attracting the lower wafer W2 are controlled independently, a first region 210 having a circular shape and a second region 220 disposed at an outside of the first region 210 in a diametrical direction and having an annular shape, as shown in FIG. 6 or the like. By way of example, the lower chuck 141 has, on the attraction surface 141a thereof, an inner rib 201 configured to separate a first region 210 and a second region 220; and an outer rib 202 provided at outer portion of the second region 220 in the diametrical direction.

The inner rib 201 and the outer rib 202 are protruded from a top surface of the chuck base 203 concentrically. The multiple pins 204 having the same height as the inner rib 201 and the outer rib 202 are also protruded from the top surface of the chuck base 203. These pins 204 are scattered on the top surface of the chuck base 203. The inner rib 201, the outer rib 202 and the pins 204 have the same height and holds the lower wafer W2 horizontally.

Further, the lower chuck 141 has, as multiple regions in which the attracting pressures for attracting the lower wafer W2 are controlled independently, multiple ring regions 221 and 222 formed by dividing the second region 220 in the diametrical direction By way of example, the lower chuck 141 has, on the attraction surface 141a thereof, an annular intermediate rib 205 configured to separate the ring region 221 arranged at an outer side in the diametrical direction from the ring region 222 arranged at an inner side in the diametrical direction. The intermediate rib 205 is arranged concentrically with respect to the inner rib 201 and the outer rib 202. The intermediate rib 205 has the same height as the inner rib 201 and the outer rib 202 and holds the lower wafer W2 horizontally along with the inner rib 201 and the outer rib 202.

Furthermore, the lower chuck 141 has, as multiple regions in which the attracting pressures for attracting the lower wafer W2 are controlled independently, multiple circular arc regions A1 and A2 formed by dividing a peripheral end portion of the second region 220 (that is, the outermost ring region 221 in the diametrical direction) in the circumferential direction, as illustrated in FIG. 9. The circular arc regions A1 and the circular arc regions A2 are arranged alternately in the circumferential direction. By way of example, four circular arc regions A1 and four circular arc regions A2 are arranged. For example, the lower chuck 141 has, on the attraction surface 141a thereof, a plurality of (for example, eight) division ribs 206 arranged in the radial direction. Each division rib 206 separates the two circular arc regions A1 and A2. The division ribs 206 have the same height as the inner rib 201 and the outer rib 202 and hold the lower wafer W2 horizontally along with the inner rib 201 and the outer rib 202. The multiple pins 204 are scattered in each of the circular arc regions A1 and A2.

In addition, the lower chuck 141 has, as multiple regions in which the attracting pressures for attracting the lower wafer W2 are controlled independently, multiple circular arc regions B1 and B2 formed by dividing the ring region 222, which is arranged at the inner side in the diametrical direction, in the circumferential direction. The circular arc regions B1 and the circular arc regions B2 are arranged alternately in the circumferential direction. By way of example, four circular arc regions B1 and four circular arc regions B2 are arranged. For example, the lower chuck 141 has, on the attraction surface 141a thereof, multiple (for example, eight) division ribs 207 arranged in the radial direction. Each division rib 207 separates the two circular arc regions B1 and B2. The division ribs 207 have the same height as the inner rib 201 and the outer rib 202 and hold the lower wafer W2 horizontally along with the inner rib 201 and the outer rib 202. The multiple pins 204 are scattered in each of the circular arc regions B1 and B2.

The bonding apparatus 41 includes, for example, a plurality of vacuum pumps 231 to 234 and 241 as a plurality of attracting pressure generators configured to generate the attracting pressures respectively in the multiple regions forming the attraction surface 141a of the lower chuck 141. Further, the bonding apparatus 41 includes, for example, a plurality of vacuum regulators 251 to 254 and 261 as a plurality of attracting pressure adjusters configured to adjust the attracting pressures respectively generated by the vacuum pumps 231 to 234 and 241 independently.

The one vacuum pump 231 is connected to the four circular arc regions A1 via pipelines which are equipped with the one vacuum regulator 251 (in FIG. 9, only the pipeline connected to the single circular arc region A1 is illustrated). Likewise, the one vacuum pump 232 is connected to the four circular arc regions A2 via pipelines which are equipped with the one vacuum regulator 252 (in FIG. 9, only the pipeline connected to the single circular arc region A2 is illustrated). Further, the one vacuum pump 233 is connected to the four circular arc regions B1 via pipelines which are equipped with the one vacuum regulator 253 (in FIG. 9, only the pipeline connected to the single circular arc region B1 is illustrated). Likewise, the one vacuum pump 234 is connected to the four circular arc regions B2 via pipelines which are equipped with the one vacuum regulator 254 (in FIG. 9, only the pipeline connected to the single circular arc region B2 is illustrated). Furthermore, the one vacuum pump 241 is connected to the first region 210 via a pipeline which is equipped with the one vacuum regulator 261.

If the control device 70 operates the one vacuum pump 231, the vacuum pump 231 generates the vacuum pressure in the four circular arc regions A1. This vacuum pressure is maintained at a predetermined set value by the vacuum regulator 251, so that the attracting pressure corresponding to the set value is generated in the four circular arc regions A1. The set value of the vacuum regulator 251 can be changed by the control device 70 and is set to be in a range from, e.g., −80 kPa to −5 kPa. Meanwhile, if the control device 70 stops the operation of the vacuum pump 231, the four circular arc regions A1 are turned back into an atmospheric pressure, so that the generation of the attracting pressure in the four circular arc regions A1 is stopped. Since the generation and the release of the attracting pressure in the other circular arc regions A2, B1 and B2 and in the first region 210 are the same as the generation and the release of the attracting pressure in the circular arc regions A1, redundant description thereof will be omitted here.

The bonding apparatus 41 according to the present exemplary embodiment is equipped with the control device 70 configured to control the vacuum pumps 231 to 234 and 241 and the vacuum regulators 251 to 254 and 261. Though the control device 70 is provided at the outside of the bonding apparatus 41 in FIG. 1 and the like, the control device 70 may be configured as a part of the bonding apparatus 41. The control device 70 corresponds to a controller described in the claims.

The control device 70 according to the present exemplary embodiment generates different attracting pressures at the same time in at least a part of the first region 210 (for example, the entire first region 210) and at least a part of the second region 220 (for example, the circular arc regions A2 and the circular arc regions B1). Accordingly, a distribution of the attracting pressures generated in the attraction surface 141a in the diametrical direction can be controlled, so that a distortion of the lower wafer W2 attracted to the attraction surface 141a can be controlled.

In comparison of the attracting pressure generated in the first region 210 and the attracting pressure generated in the circular arc regions A2 and B1, either of these attracting pressures may be set to be larger than the other. Further, in the present exemplary embodiment, though the attracting pressure generated in the first region 210 and the attracting pressure generated in the circular arc regions A1 and B2 are same, either one of them may be set to be larger or smaller than the other. Further, when attracting the lower wafer W2 to the attraction surface 141a, the attracting pressures may not be generated in the circular arc regions A1 and the circular arc regions B2. That is, in the present exemplary embodiment, though the attracting pressures are generated in the entire attraction surface 141a at the same time when the lower wafer W2 is attracted, the attracting pressure may be generated in a part of the attraction surface 141a.

According to the present exemplary embodiment, the lower wafer W2 and the upper wafer W1 can be bonded while controlling the distortion of the lower wafer W2. Therefore, an attachment distortion between the lower wafer W2 and the upper wafer W1 can be reduced. The attachment distortion is represented by a magnitude of a position deviation left when the upper wafer W1 and the lower wafer W2 are moved relatively in parallel to each other, moved by being rotated and expanded/contracted analogously such that the position deviation between the alignment marks of the upper wafer W1 and the alignment marks of the lower wafer W2 when viewed from the top is minimized, for example. The changing of the set value of the attracting pressure, the bonding performed according to the changed set value and the measuring of the attachment distortion after the bonding may be performed repeatedly until the attachment distortion falls comes into a tolerance range. The changing of the distribution of the attracting pressure may be performed based on multiple data accumulated in the past. The data is not particularly limited as long as it indicates a relationship between the set value (or record) of the attracting pressure and the attachment distortion, and the data may be stored in an information recording medium and read out to be used.

Through repeated researches, the present inventors have found out that one reason for the attachment distortion may be found from anisotropy of a physical property of the lower wafer W2 such as Young's modulus. The physical property such as Young's modulus of the lower wafer W2 varies in the circumferential direction periodically. The attachment distortion caused by this variation becomes conspicuous as it goes outwards from the inner side of the lower wafer W2 in the diametrical direction. It is because a distance between, for example, a [0-11] direction and a [001] direction in the circumferential direction increases as it goes outwards from the inner side of the lower wafer W2 in the diametrical direction.

As a resolution, the control device 70 according to the present exemplary embodiment generates different attracting pressures in a part of the second region 220 arranged at an outer side than the first region 210 in the diametrical direction (for example, the circular arc regions A1 and the circular arc regions B2) and another part of the second region 220 (for example, the circular arc regions A2 and the circular arc regions B1) at the same time. Accordingly, the distortion of the lower wafer W2 caused in the second region 220 which is apart from the center of the lower wafer W2 can be controlled.

In comparison of the attracting pressure generated in the circular arc regions A1 and B2 and the attracting pressure generated in the circular arc regions A2 and B1, either of these attracting pressures may be set to be larger than the other. Further, in the present exemplary embodiment, though the attracting pressure generated in the circular arc regions A1 and the attracting pressure generated in the circular arc regions B1 are same, either one of them may be set to be larger or smaller than the other. Likewise, though the attracting pressure generated in the circular arc regions A2 and the attracting pressure generated in the circular arc regions B1 are same in the present exemplary embodiment, either one of them may be set to be larger or smaller than the other.

The control device 70 according to the present exemplary embodiment generates the different attracting pressures at the same time in, among the multiple ring regions 221 and 222 formed by dividing the second region 220 in the diametrical direction, at least a part (for example, the circular arc regions A1) of the ring region 221 arranged at the outer side in the diametrical direction and at least a part (for example, the circular arc regions B1) of the ring region 222 arranged at the inner side in the diametrical direction. Accordingly, the distortion of the lower wafer W2 can be controlled based on the distance from the center of the lower wafer W2 in the diametrical direction.

The control device 70 according to the present exemplary embodiment controls the attracting pressures independently in the neighboring circular arc regions (here, the circular arc regions A1 and A2 belonging to the outermost ring region 221 in the diametrical direction) among the multiple circular arc regions formed by dividing the peripheral end of the second region 220 in the circumferential direction, and generates the different attracting pressures in these neighboring circular arc regions at the same time. This is because the physical property such as Young's modulus of the lower wafer W2 varies periodically and the attachment distortion caused by this variation is most conspicuous at the peripheral end of the lower wafer W2.

Likewise, the control device 70 may control the attracting pressures independently in the neighboring circular arc regions (for example, the circular arc regions B1 and B2) among the multiple circular arc regions formed by dividing the rest ring region (here, the ring region 222 arranged at the inner side in the diametrical direction) in the circumferential direction, and may generate different attracting pressures in these neighboring circular arc regions at the same time. Accordingly, it is possible to control the distortion of the lower wafer W2 in the ring region 222 arranged at the inner side in the diametrical direction as well as in the ring region 221 arranged at the outer side in the diametrical direction. This may be particularly effective when the lower wafer W2 has a large diameter.

A Young's modulus, a Poisson's ratio and a shear modulus of a single crystalline silicon wafer varies at a cycle of 90°. Directions (a direction of 0°, a direction of 90°, a direction of 180°, and a direction of 270°) at the cycle of 90° with respect to a [0-11] direction (direction of 0°) are referred to as "0°-base-90°-cycle direction" together. Further, directions (a direction of 45°, a direction of 135°, a direction of 225°, and a direction of) 315° at the cycle of 90° with respect to a [0-10] direction (direction of 45°) are referred to as "45°-base-90°-cycle direction" together. The Young's modulus of the single crystalline silicon wafer is highest at the 0°-base-90°-cycle direction and the lowest at the 45°-base-90°-cycle direction. Further, the Poisson's ratio and the shear modulus are highest at the 45°-base-90°-cycle direction and the lowest at the 0°-base-90°-cycle direction.

Thus, in case that the lower wafer W2 is the single crystalline silicon wafer, the circular arc regions A1 may be arranged in the 0°-base-90°-cycle direction, and the circular arc regions A2 may be arranged in the 45°-base-90°-cycle direction, as illustrated in FIG. 9. That is, the circular arc regions A1 and A2 in which the attracting pressures are controlled independently are arranged alternately in the circumferential direction. By way of non-limiting example, the four circular arc regions A1 and the four circular arc regions A2 may be arranged.

Likewise, in case that the lower wafer W2 is the single crystalline silicon wafer, the circular arc regions B1 may be arranged in the 0°-base-90°-cycle direction, and the circular arc regions B2 may be arranged in the 45°-base-90°-cycle direction, as illustrated in FIG. 9. That is, the circular arc regions B1 and B2 in which the attracting pressures are controlled independently are arranged alternately in the circumferential direction. By way of non-limiting example, the four circular arc regions B1 and the four circular arc regions B2 may be arranged.

Moreover, the control device 70 of the present exemplary embodiment generates the different attracting pressures at the same time in the circular arc regions having the same angle (for example, the circular arc regions A1 and B1, or the circular arc regions A2 and B2). However, the exemplary embodiment is not limited thereto. By way of example, the control device 70 may generate different attracting pressures at the same time in the circular arc regions having different angles (for example, the circular arc regions A1 and B2, or the circular arc regions A2 and B1).

Modification Examples and Improvements

So far, the exemplary embodiment of the substrate processing apparatus and the substrate processing method have been described. However, the present disclosure is not limited to the above-described exemplary embodiment or the like. Various changes, corrections, replacements, addition, deletion and combinations may be made within the scope of the claims, and all of these are included in the scope of the inventive concept of the present disclosure.

Figure 10:
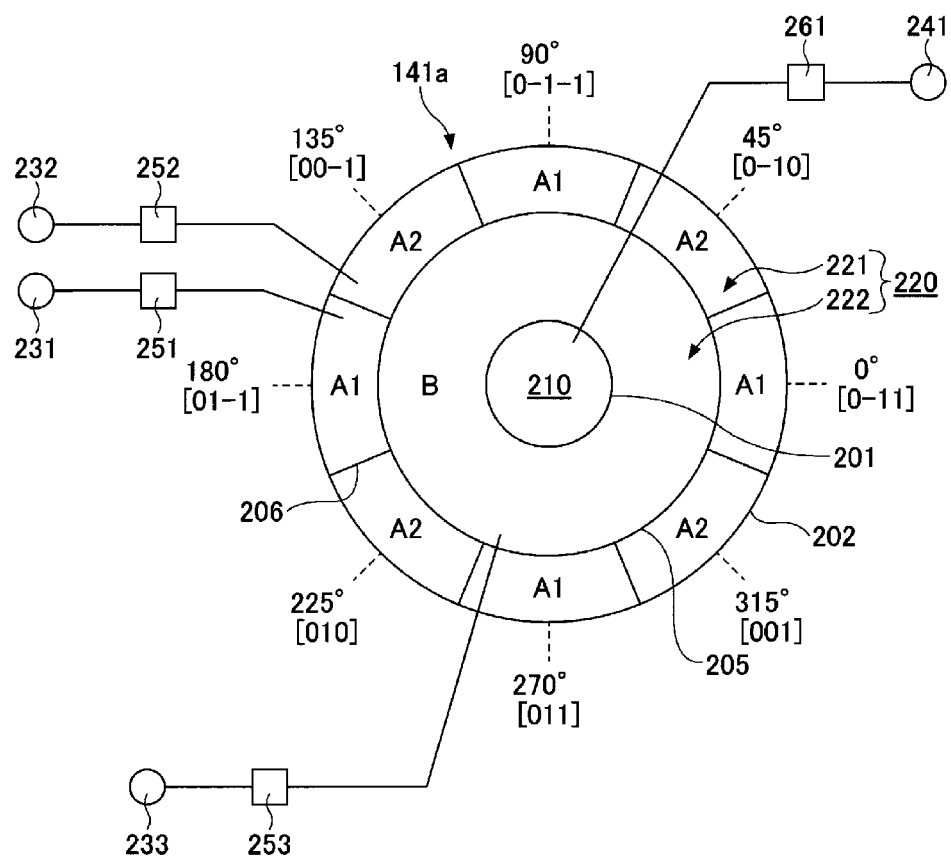
FIG. 10 is a diagram illustrating a lower chuck, vacuum pumps and vacuum regulators according to a first modification example.

In the above-described exemplary embodiment, the control device 70 generates the different attracting pressures in the neighboring circular arc regions B1 and B2 at the same time. However, the present disclosure is not limited thereto. The control device 70 may generate the same attracting pressure in the neighboring circular arc regions B1 and B2. In this case, since the ring region 222 at the inner side in the diametrical direction need not be partitioned into the multiple circular arc regions B1 and B2 in the circumferential direction, the ring region 222 may be composed of a single annular region B as shown in FIG. 10. This single annular region B is connected to the single vacuum pump 233 via the pipeline which is equipped with the single vacuum regulator 253. Since generation and release of the attracting pressure in this annular region B are the same as the generation and the release of the attracting pressure in the circular arc region A1, redundant description will be omitted.

Figure 11:
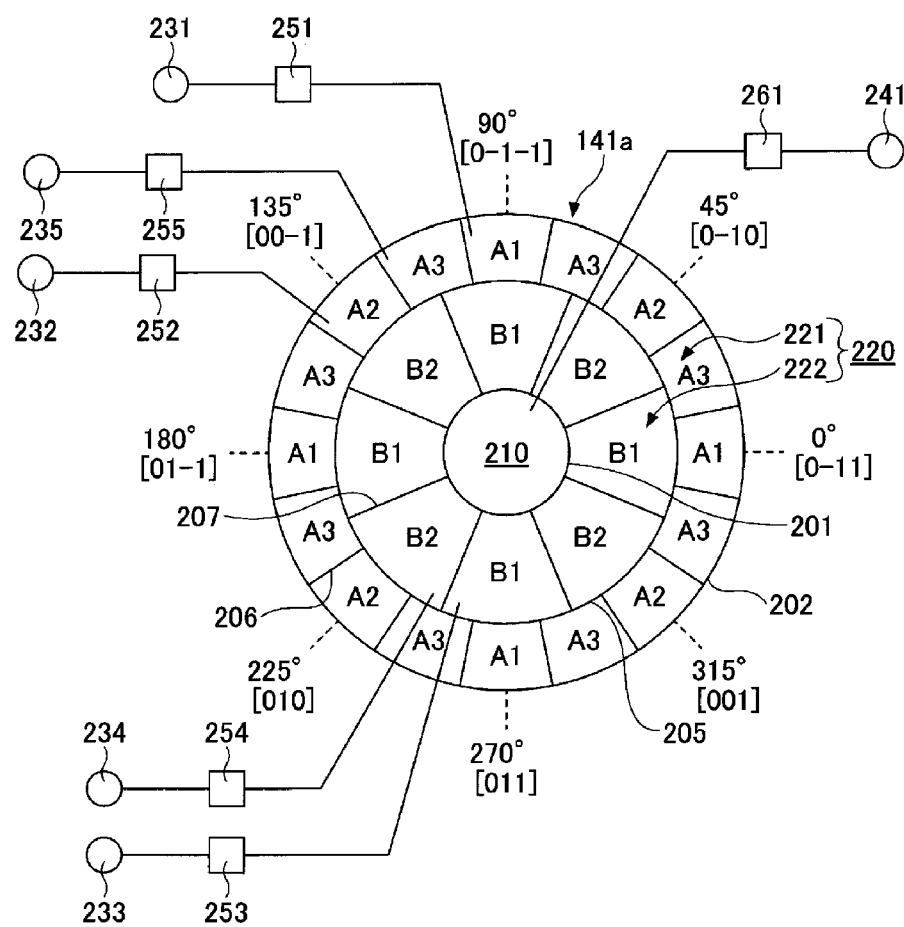
FIG. 11 is a diagram illustrating a lower chuck, vacuum pumps and vacuum regulators according to a second modification example.

In the above-described exemplary embodiment, the ring region 221 at the outer side in the diametrical direction and the ring region 222 at the inner side in the diametrical direction are divided into the same number of regions in the circumferential direction. However, the ring regions 221 and 222 may be divided in different numbers. As depicted in FIG. 11, the number of divisions of the ring region 221 at the outer side in the diametrical direction may be larger than the number of divisions of the ring region 222 at the inner side in the diametrical direction. It is because the attachment distortion may easily occur as it goes from the inner side of the lower wafer W2 in the diametrical direction toward the outer side thereof.

The lower chuck 141 shown in FIG. 11 has, as multiple regions in which the attracting pressure is controlled independently, three circular arc regions A1, A2 and A3 formed by dividing the ring region 221 in the circumferential direction. The circular arc regions A3 are disposed between the circular arc regions A1 arranged at the 0°-base-90°-cycle direction and the circular arc regions A2 arranged at the 45°-base-90°-cycle direction. With this configuration, the attracting pressure distribution in the circumferential direction of the lower wafer W2 can be controlled more accurately.

As shown in FIG. 11, division lines (for example, the division ribs 206) for dividing the ring region 221 at the outer side in the diametrical direction into the multiple circular arc regions A1, A2 and A3 in the circumferential direction and division lines (for example, the division ribs 207) for dividing the ring region 222 at the inner side in the diameter direction into the multiple regions B1 and B2 in the circumferential direction may be deviated in the circumferential direction. Points where the attracting pressure changes discontinuously in the ring region 221 at the outer side in the diametrical direction and points where the attracting pressure changes discontinuously in the ring region 222 at the inner side in the diametrical direction may be set to be deviated in the circumferential direction.

The eight circular arc regions A3 shown in FIG. 11 are connected to the single vacuum pump 235 via the pipelines which are equipped with the single vacuum regulator 255 (in FIG. 11, only the pipeline connected to the single circular arc region A3 is illustrated). Since generation and release of the attracting pressure in the circular arc region A3 are the same as the generation and the release of the attracting pressure in the circular arc region A1, redundant description will be omitted herein.

The lower chuck 141 illustrated in FIG. 9 to FIG. 11 has, as the multiple regions in which the attracting pressure is controlled independently, the two ring regions 221 and 222 formed by dividing the second region 220 in the diametrical direction. However, the number of the ring regions may not be limited to two. The number of the ring regions may be one (that is, the second region 220 is not divided in the diametrical direction), or may be more than two.

FIG. 12 is a diagram illustrating the lower chuck, vacuum pumps and vacuum regulators according to a third modification example. As multiple regions in which the attracting pressure is controlled independently, the lower chuck 141 of this modification example shown in FIG. 12 has four ring regions 221, 222, 223 and 224 formed by dividing the second region 220 in the diametrical direction.

The ring region 221, which is the first one from the outer side in the diametrical direction, is composed of circular arc regions A1 and A2 which are repeatedly arranged alternately in the circumferential direction. In the neighboring two circular arc regions A1 and A2, the attracting pressure is controlled independently. Likewise, the ring region 222, which is the second one from the outer side in the diametrical direction, is composed of circular arc regions B1 and B2 which are repeatedly arranged alternately in the circumferential direction. In the neighboring two circular arc regions B1 and B2, the attracting pressure is controlled independently.

Further, the ring region 223, which is the third one from the outer side in the diametrical direction, is composed of circular arc regions C1 and C2 which are repeatedly arranged alternately in the circumferential direction. In the neighboring two circular arc regions C1 and C2, the attracting pressure is controlled independently. One vacuum pump 235 is connected to the four circular arc regions C1 via pipelines which are equipped with one vacuum regulator 255 (in FIG. 12, only the pipeline connected to the single circular arc region C1 is illustrated). One vacuum pump 236 is connected to the four circular arc regions C2 via pipelines which are equipped with one vacuum regulator 256 (in FIG. 12, only the pipeline connected to the single circular arc region C2 is illustrated). Since generation and release of the attracting pressure in the circular arc regions C1 and C2 are the same as the generation and the release of the attracting pressure in the circular arc region A1, redundant description will be omitted here.

Besides, the ring region 224, which is the fourth one from the outer side in the diametrical direction, is composed of circular arc regions D1 and D2 which are repeatedly arranged alternately in the circumferential direction. In the neighboring two circular arc regions D1 and D2, the attracting pressure is controlled independently. One vacuum pump 237 is connected to the four circular arc regions D1 via pipelines which are equipped with one vacuum regulator 257 (in FIG. 12, only the pipeline connected to the single circular arc region D1 is illustrated). One vacuum pump 238 is connected to the four circular arc regions D2 via pipelines which are equipped with one vacuum regulator 258 (in FIG. 12, only the pipeline connected to the single circular arc region D2 is illustrated). Since generation and release of the attracting pressure in the circular arc regions D1 and D2 are the same as the generation and the release of the attracting pressure in the circular arc region A1, redundant description will be omitted here.

In addition, the lower chuck 141 of the modification example shown in FIG. 12 has, as multiple regions in which the attracting pressure is controlled independently, two ring regions 211 and 212 and one circular region 213 formed by dividing the first region 210 in the diametrical direction. The ring region 211 arranged at the outer side in the diametrical direction and the ring region 212 arranged at the inner side in the diametrical direction are separated by an annular rib. Further, the ring region 212 arranged at the inner side in the diametrical direction and the circular region 213 are separated by an annular rib. The annular ribs provided in the first region 210 are disposed concentrically with respect to the inner rib 201 and the outer rib 202 shown in FIG. 9 and the like. The annular ribs disposed in the first region 210 have the same height as the pins 204 and hold the lower wafer W2 horizontally along with the pins 204 and so forth. Further, in the present modification example, the two ring regions 211 and 212 and the circular region 213 correspond to division regions described in the claims.

The ring region 211, which is the first one from the outer side in the diametrical direction in the first region 210, is connected to one vacuum pump 241 via a pipeline which is equipped with one vacuum regulator 261. Further, the ring region 212, which is the second one from the outer side in the diametrical direction in the first region 210, is connected to one vacuum pump 242 via a pipeline which is equipped with one vacuum regulator 262. Furthermore, the circular region 213, which is third one from the outer side in the diametrical direction in the first region 210, is connected to one vacuum pump 243 via a pipeline which is equipped with one vacuum regulator 263. Since generation and release of the attracting pressure in the ring regions 211 and 212 and the circular region 213 are the same as the generation and the release of the attracting pressure in the circular arc region A1, redundant description will be omitted.

The control device 70 according to the present modification example generates different attracting pressures in the neighboring two division regions (for example, the ring region 211 arranged at the outer side in the diametrical direction and the ring region 212 arranged at the inner side in the diametrical direction, and/or the ring region 212 arranged at the inner side in the diametrical direction and the circular region 213) at the same time. Accordingly, the distortion near the central portion of the lower wafer W2 pressured by the push pin 191 of the striker 190 can be controlled.

Furthermore, though the number of the ring regions constituting the first region 210 is two in FIG. 12, it may be one or more than two. Further, the ring region (for example, the ring region 211) constituting the first region 210 may be divided into multiple regions in the circumferential direction, the same as the ring region (for example, the ring region 221) constituting the second region 220.

The lower chuck 141 according to the above-described exemplary embodiment and the modification examples is configured to vacuum-attract the lower wafer W2. However, the lower chuck 141 may be configured to attract the lower wafer W2 electrostatically. In this case, the attracting pressure generator includes, for example, an internal electrode embedded in the lower chuck 141. Meanwhile, the attracting pressure adjuster includes, for example, a power adjuster configured to adjust a power to be supplied to the internal electrode. The power adjuster may be a step-down DC/DC converter, a step-up DC/DC converter, or the like.

In the above-described exemplary embodiment and the modification examples, the distortion caused at the lower wafer W2 attracted to the lower chuck 141 is controlled. However, a distortion caused at the upper wafer W1 attracted to the upper chuck 140 may be controlled. That is, the inventive concept of the present disclosure may be applied to the upper chuck 140, and, in this case, the upper chuck 140 may correspond to the holder described in the claims and the lower chuck 141 corresponds to the facing holder described in the claims. Further, the inventive concept of the present disclosure may be applied to both the upper chuck 140 and the lower chuck 141. Furthermore, the inventive concept of the present disclosure may be also applied to an apparatus other than the bonding apparatus 41, for example, a dicing apparatus or the like. The inventive concept of the present disclosure may be applied to any of various apparatuses as long as they have a holder configured to hold the substrate.

This application claims the benefit of Japanese Patent Application No. 2018-005987 filed on Jan. 17, 2018, the entire disclosures of which are incorporated herein by reference.

EXPLANATION OF CODES

According to the exemplary embodiments, it is possible to control distortion of the substrate which is attracted to the attraction surface.

We claim:

1. A bonding apparatus, comprising:
a holder having thereon an attraction surface configured to horizontally attract a substrate and including multiple regions in which attracting pressures for attracting the substrate are controlled independently;
multiple attracting pressure generators configured to independently generate the attracting pressures respectively in the multiple regions forming the attraction surface;
multiple attracting pressure adjusters configured to independently adjust the attracting pressures respectively generated by the attracting pressure generators;
a facing holder configured to be arranged to face the holder and hold a second substrate, which is another substrate to be bonded to the substrate;
a pusher configured to press down a central portion of the second substrate onto a central portion of the substrate; and
a controller configured to control the multiple attracting pressure generators, the multiple attracting pressure adjusters, and the pusher,
wherein the holder comprises ribs configured to separate the multiple regions,
wherein the multiple regions include a first region having a circular shape, and a second region having an annular shape and being disposed at an outside of the first region in a diametrical direction,
the second region includes a plurality of first circular arc regions and a plurality of second circular arc regions, which are arranged in a circumferential direction, wherein adjacent two first circular arc regions sharing same radial boundaries form 90 degrees, and adjacent two second circular arc regions sharing same radial boundaries form 90 degrees and,
wherein the controller is further configured to control a distortion of the substrate, by contacting the central portion of the second substrate with the central portion of the substrate and generating different attracting pressures from one first circular arc region to another second circular arc region, such that a plurality of alignment marks formed on the substrate and a plurality of alignment marks formed on the second substrate are respectively overlapped, when viewed in a vertical direction, while an entire bonding surface of the substrate and an entire bonding surface of the second substrate are bonded.

2. The substrate processing apparatus of claim 1, wherein the holder has, as the multiple regions in which the attracting pressures are controlled independently, multiple ring regions formed by dividing the second region in the diametrical direction, and
the controller generates the different attracting pressures in at least a part of a first one of the multiple ring regions and in at least a part of a second one of the multiple ring regions.

3. The substrate processing apparatus of claim 1, wherein the holder has, as the multiple regions in which the attracting pressures are controlled independently, multiple division regions formed by dividing the first region in the diametrical direction, and
the controller generates the different attracting pressures in neighboring two of the multiple division regions.

4. A substrate bonding method of generating, in an attraction surface configured to attract a substrate, attracting pressures for attracting the substrate, the substrate bonding method comprising:
controlling the attracting pressures generated respectively in multiple regions independently, the multiple regions forming the attraction surface to control a distortion of the substrate, by contacting a central portion of a second substrate with a central portion of the substrate; and
generating different attracting pressures from one first circular arc region and to another second circular arc region, such that a plurality of alignment marks formed on the substrate and a plurality of alignment marks formed on the second substrate are respectively overlapped, when viewed in a vertical direction, while an entire bonding surface of the second substrate and an entire bonding surface of the substrate are bonded,
wherein the multiple regions include a first region having a circular shape, and a second region having an annular shape and being disposed at an outside of the first region in a diametrical direction,
the second region includes a plurality of first circular arc regions and a plurality of second circular arc regions, which are arranged in a circumferential direction, wherein adjacent two first circular arc regions sharing same radial boundaries form 90 degrees, and adjacent two second circular arc regions sharing same radial boundaries form 90 degrees.

5. The substrate processing method of claim 4, further comprising:
wherein the attracting pressures generated respectively in multiple ring regions formed by dividing the second region in the diametrical direction is controlled independently, and
the different attracting pressures are generated in at least a part of a first one of the multiple ring regions and in at least a part of a second one of the multiple ring regions.

6. The substrate processing method of claim 4, wherein the attracting pressures generated respectively in multiple division regions formed by dividing the first region in the diametrical direction is controlled independently, and
the different attracting pressures are generated in neighboring two of the multiple division regions.

7. The substrate processing method of claim 4, wherein the substrate attracted to the attraction surface by the attracting pressures is bonded to another substrate while the substrates are arranged to face each other.

* * * * *